US006208031B1

(12) United States Patent
Fraivillig

(10) Patent No.: US 6,208,031 B1
(45) Date of Patent: Mar. 27, 2001

(54) CIRCUIT FABRICATION USING A PARTICLE FILLED ADHESIVE

(75) Inventor: James Fraivillig, Austin, TX (US)

(73) Assignee: Fraivillig Technologies, Marlboro, MA (US)

( * ) Notice: Subject to any disclaimer, the term of this patent is extended or adjusted under 35 U.S.C. 154(b) by 0 days.

(21) Appl. No.: 09/267,497

(22) Filed: Mar. 12, 1999

(51) Int. Cl.[7] ............................................. A01L 23/48
(52) U.S. Cl. ......................... 257/758; 257/759; 257/789
(58) Field of Search .................................. 257/643, 758, 257/759, 762, 789, 792, 793

(56) References Cited

U.S. PATENT DOCUMENTS

| | | | |
|---|---|---|---|
| 3,652,907 | * | 3/1972 | Page et al. .................. 317/235 R |
| 4,118,595 | * | 10/1978 | Pfahnl et al. ...................... 427/93 |
| 4,141,055 | * | 2/1979 | Berry et al. ...................... 361/410 |
| 5,120,665 | * | 6/1992 | Tsukagoshi et al. .................. 437/8 |
| 5,164,816 | * | 11/1992 | Nishizawa et al. .................. 257/759 |
| 5,384,690 | * | 1/1995 | Davis ................................ 257/747 |
| 5,688,584 | * | 11/1997 | Casson et al. .................... 428/209 |
| 5,781,412 | * | 7/1998 | de Sorgo .......................... 257/702 |
| 5,977,642 | * | 11/1999 | Appelt et al. ...................... 257/780 |

\* cited by examiner

Primary Examiner—Eddie C. Lee
Assistant Examiner—Lourdes Cruz
(74) Attorney, Agent, or Firm—Rosenthal & Osha L.L.P.

(57) ABSTRACT

A circuit assembly includes a substrate layer, a first conductive layer mounted to the substrate layer and a second conductive layer. The first and second conductive layers are adhered by an adhesive layer having non-electrically conductive particles for separating the first and second conductive layers.

15 Claims, 3 Drawing Sheets

CIRCUIT FABRICATION USING A PARTICLE FILLED ADHESIVE

BACKGROUND OF THE INVENTION

The invention relates to circuit fabrication. More particularly, the invention involves the use of a particle filled adhesive coating in circuit fabrication.

Printed circuit boards (PCBs) typically are used as a replacement for wiring to connect electrical components of an intricate electrical system. PCBs save space, weight and labor, and increase reliability of the circuit as compared with round wire connections. Instead of metal round wire, the conventional PCB includes a metal foil layer (e.g., a copper foil layer) which is adhered to a base (e.g., a fiberglass/epoxy board). Once adhered to the base, the foil layer is then imaged and etched into a desired pattern of conductive lines to form a circuit. Foil layers may be adhered to both sides of the base to produce a double-sided circuit.

A particular type of printed circuitry, often called flexible circuits, or "flex," has the same basic structure as conventional hard PCBs, or "hardboards." Flexible printed circuits typically offer many advantages over standard hardboard printed circuits and round wire technology. For example, due to its flexibility, connection of a flexible circuit to a read/write head of a hard disk drive permits cycling of the head across the disk drive many millions of times.

The flexible printed circuit is formed from at least one conductive foil layer (e.g., a copper foil layer) that is adhered to a flexible base film. This base film typically is an electrically nonconductive, or dielectric, film substrate, such as polyimide film or a polyester film (e.g., PEN film or PET film). Similar to the PCB, once adhered to the base film, the foil typically is then imaged and etched into a desired pattern to form a circuit. The foil may be adhered to both sides of the base film to produce a double-sided flexible circuit. Adhesives (e.g., polyimides, epoxies and acrylics) may be used to bond the foil layer to the film substrate. However, the foil layer may also be adhered to the film substrate without adhesives by using, for example, plating or vapor deposition.

Although the base film provides surfaces for a double-sided circuit, many complex circuit designs require more than two layers for electrical connection requirements. Therefore, quite often the flexible circuit requires additional copper layers to yield a "multi-layer" circuit. The inner double-sided circuit is often called the core of the flexible circuit.

Referring to FIG. 1, as an example, to form a multi-layer circuit 10, metal foil layers 12 (only one foil layer 12 is shown in FIG. 1) are adhered to, or laminated, to both sides of a dielectric film substrate 14 to create an inner core 16. The foil layers 12 are then imaged and etched to form conductor lines 18, as shown in FIG. 2, (only one conductor line 18 is shown in FIG. 2). Thus, the inner core 16 provides up to two etched foil layers of conductor lines.

To form additional etched layers, additional outer foil layers 20 may be laminated to inner core 16 on top of the existing etched foil layers (i.e., on top of existing conductor lines 18). Outer foil layers 20 may then be etched to create additional conductor lines.

Lamination of the foil layers typically includes the use of high temperature and high pressure. As a result, the adhesive that bonds adjacent layers together tends to flow away during lamination. In this manner, conductor lines on different layers may contact each other. To prevent this from occurring, dielectric films 22 are placed between adjacent foil layers.

Thus, multi-layer flexible circuits have traditionally used dielectric films to separate adjacent etched foil layers. As a result, typically, the overall thickness of the flexible circuit is limited by the thickness of these layers.

SUMMARY OF THE INVENTION

The invention is generally directed to using a particle-laden adhesive compound to mount conductive layers of a circuit assembly (e.g., a flexible printed circuit or a printed circuit board (PCB)) together.

In general, in one aspect, a circuit assembly has a substrate layer, a first conductive layer mounted to the substrate layer and a second conductive layer. The circuit assembly also has an adhesive layer mounting the first and second conductive layers together and having particles for separating the first and second conductive layers.

In accordance with one or more embodiments of the invention, the substrate layer may be a flexible substrate of a flexible circuit. The particles may be dielectric particles, thermally conductive materials or ceramic particles. The adhesive layer may also include an adhesive base, and the particles have a concentration in the adhesive layer between two and forty percent. The adhesive layer may be between four and 150 microns thick. The adhesive layer may include a thermoplastic adhesive or a thermoset adhesive. The first conductive layer may have an etched circuit pattern.

In general, in one aspect a method for making a circuit assembly includes mixing particles with an adhesive base to form an adhesive material, using the adhesive material to mount at least two conductive layers of the circuit assembly together and using the material to keep conductive traces of the layers isolated.

In accordance with one or more embodiments of the invention, the mixing particles with an adhesive base may be mixing dielectric particles, thermally conductive particles or ceramic particles with an adhesive base.

In general, in one aspect, a circuit assembly has an inner core, a first conductive layer mounted to the inner core and a second conductive layer. The circuit assembly also has an adhesive layer mounting the first and second conductive layers together having particles for separating the first and second conductive layers. The circuit assembly may include a third conductive layer and another adhesive layer mounting the second and third conductive layers together having particles for separating the second and third conductive layers.

In general, in one aspect a flexible circuit has an inner flexible core, a first foil layer mounted to the inner core and a second foil layer. The flexible circuit also has an adhesive layer mounting the first and second foil layers together having particles for separating the first and second conductive layers.

Other advantages and features will become apparent from the following description, the claims and the attached drawings.

DETAILED DESCRIPTION

Figure 1:
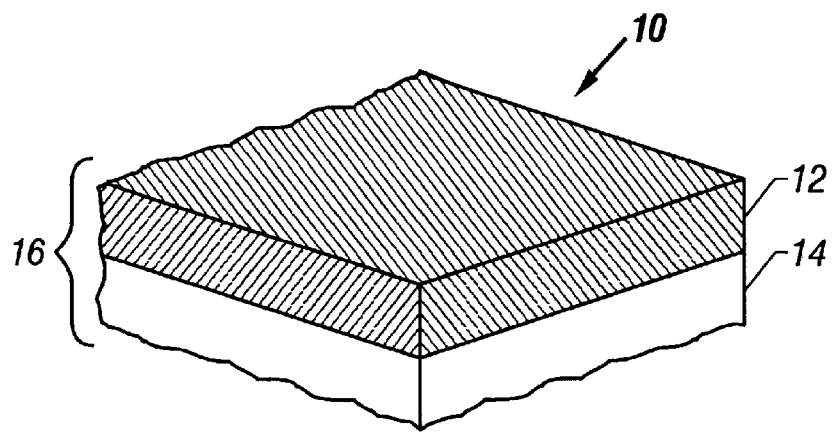
FIG. 1 is a perspective view of an unetched core of a flexible circuit of the prior art.
Figure 2:
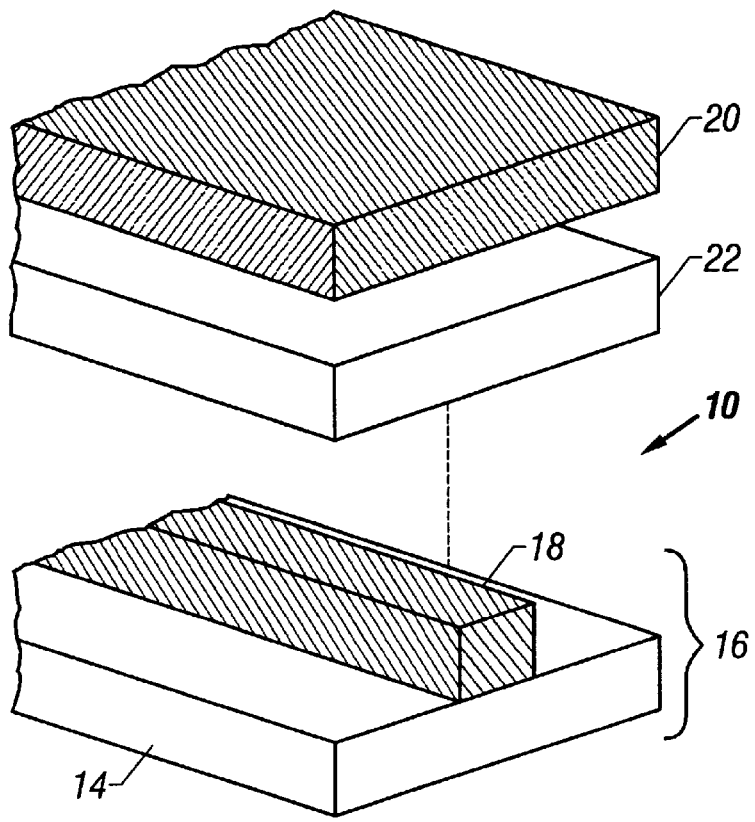
FIG. 2 is an exploded perspective view of a partially completed flexible circuit of the prior art.
Figure 3:
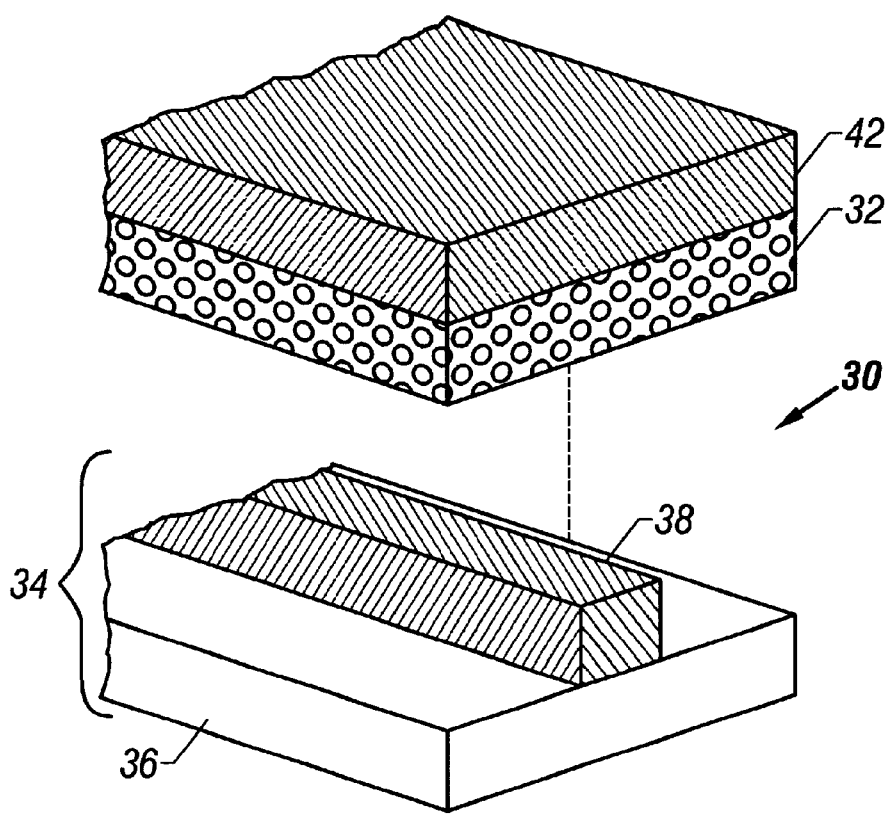
FIG. 3 is an exploded perspective view of a partially completed flexible circuit according to an embodiment of the invention.

Referring to FIG. 3, a multi-layer printed circuit, such as a flexible circuit 30, does not use dielectric films to separate outer etched, conductive foil layers. Instead, circuit 30 uses a layer 32 of a particle-laden adhesive compound to separate these foil layers.

As typical, flexible circuit 30 has an inner core 34 that is formed from two inner foil (e.g., copper foil) layers (only one foil layer is shown in FIG. 3) that are laminated to opposite sides of a dielectric substrate film 36. The inner foil layers are imaged and etched to form inner conductor lines 38 (only one conductor line 38 is shown) of the circuit.

Unlike typical multi-layer flexible circuits, circuit 30 does not have dielectric films between the outer, etched foil layers and inner core 34. Instead, adhesive layer 32 is used to adhere outer foil layers to either the inner core layers or other outer foil layers, e.g., outer foil layer 42 is adhered to inner core 34 by adhesive layer 32. The adhesive layer not only bonds the outer foil layers to other foil layers, adhesive layer 32 also maintains electrical isolation between adjacent foil layers. The electrical isolation is maintained even though nothing other than adhesive layer 32 is between the foil layers.

Figure 6:
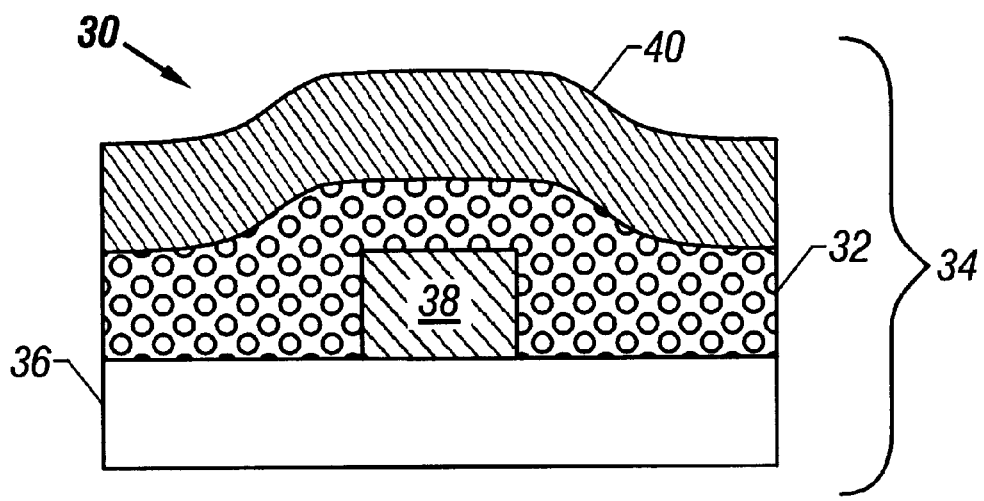
FIG. 6 is a cross-sectional view taken along section line 6—6 of FIG. 5.

To achieve electrical isolation, the adhesive compound is formed from an adhesive base that is mixed with small particles, such as ceramic particles. The maximum dimension of the ceramic particles is small enough to ensure that adhesive layer 32 encapsulates conductor lines 38 on the foil layers. However, referring to FIG. 6, the ceramic particles are also large enough to ensure that adhesive layer 32 is not pushed out of the way during the lamination of adjacent foil layers and to ensure that a minimal dielectric spacing is maintained between the adjacent, etched foil layers (i.e., a minimum spacing is maintained between the conductor lines in adjacent foil layers). The size of the ceramic particles is independent of the thickness of the adhesive layer. For example, in one embodiment, the diameters of some of the ceramic particles are approximately equal to the thickness of the adhesive while, in one embodiment, the diameters of all the ceramic particles are smaller than the thickness of the adhesive.

The ceramic particles and the adhesive base of the adhesive compound are both dielectric materials. The ceramic particles in adhesive layer 32 also serve as a thermal conduit to transfer heat through flexible circuit 30.

To make inner core 34 of flexible circuit 30, unetched metal foil layers are formed on both sides of a dielectric film 36. The formation of the unetched metal foil layers may be accomplished, for example, with a stand-alone foil layer. The stand-alone foil layer may either be rolled annealed on dielectric film 36 or electrodeposited on dielectric film 36. For roll annealing, an adhesive (e.g., polyimides, epoxies, and acrylics) is used to adhere the stand-alone foil layer to dielectric film 36. The results of the roll annealing process are more flexible than those of the electrodepositing, but the roll annealing process is more expensive.

Instead of using one of the two above-described techniques to mount a stand-alone foil layer to dielectric film 36, a metal, such as copper, can be electrodeposited directly on dielectric film 36 to create a foil layer on film 36. With this technique, a seed layer is initially added to film 36 to facilitate the electrodeposition.

Once the foil layers of inner core 34 are created, circuit patterns in these layers are created. In this manner, the foil layers of the core 34 are imaged and etched to create conductive lines 38 on both sides of core 34.

Figure 4:
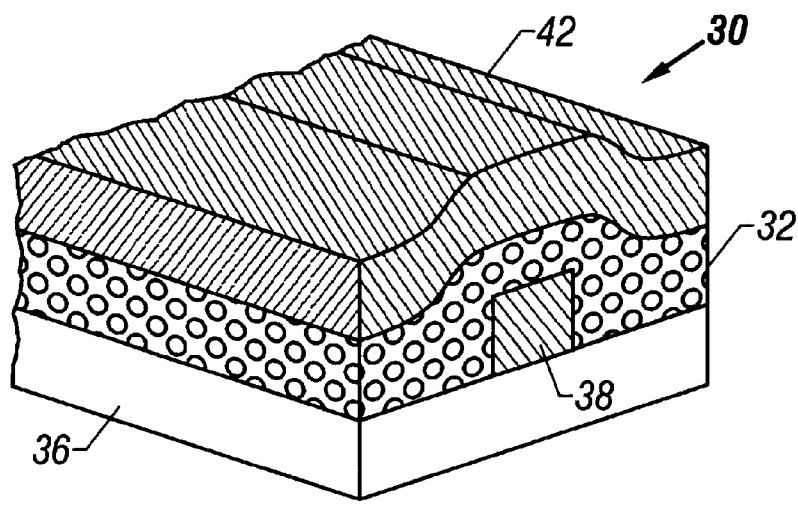
FIG. 4 is a perspective view of the circuit of FIG. 3 after lamination of an outer foil layer.
Figure 5:
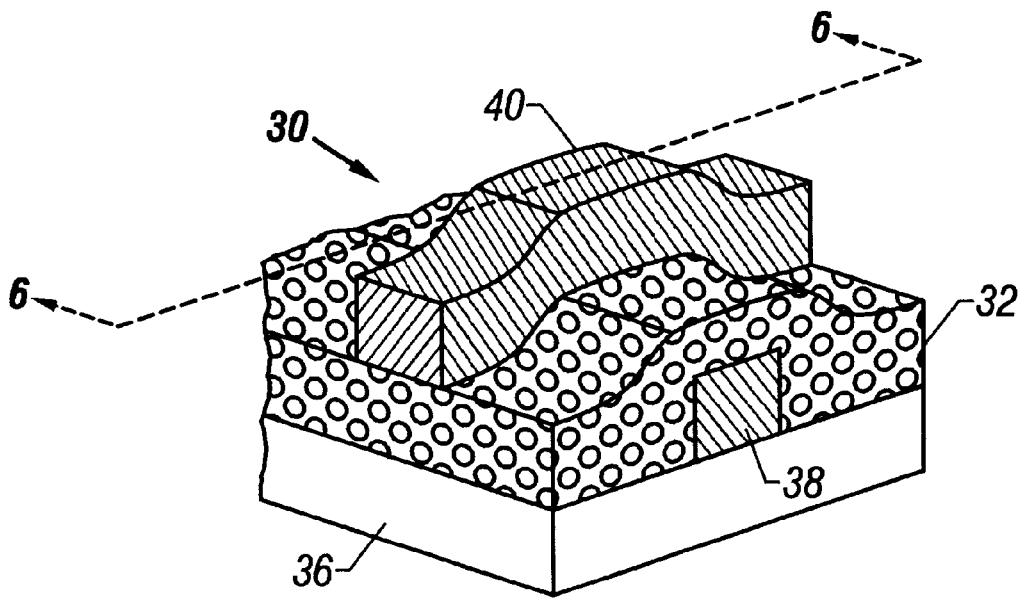
FIG. 5 is a perspective view of the circuit of FIG. 4 after etching of the outer foil layer.

Next, additional layers of flexible circuit 30 are formed. Referring to FIGS. 3, 4 and 5, as an example, to form outer conductive lines 40, an outer foil layer 42 is first coated (via conventional web coating equipment) with the particle-laden adhesive compound and then laminated to inner core 34. Adhesive layer 32 is thick enough to ensure encapsulation of conductive lines 38 of core 34. As an examples, the thickness of adhesive layer 32, in some embodiments, varies from four to 150 microns. The formation of adhesive layer 32 requires solvent-drying and curing (e.g., via forced convection), two conditions which are dependent on the base adhesive type and the thickness of adhesive layer 32.

Next, outer foil layer is etched to form one or more outer conductive lines 40 (see FIG. 5). One or more additional layers may be formed using the particle-laden adhesive compound on copper foil to adhere each additional layer to the outermost etched layer.

In one embodiment, to form the adhesive compound used in the adhesive layer 32, ceramic powder is added to an adhesive base. The adhesive base might be, for example, a thermoplastic, such as a polyimide, polyester or a polyimide. The thermoplastic adhesives can include epoxy and cross-linking additives. The adhesive base might also be a thermoset, such as an epoxy, acrylic or phenolic. The adhesive base may be a wet adhesive and include silane additives.

The ceramic powder is mixed thoroughly with the adhesive base to form the adhesive compound before the compound is applied in circuit 30 to form adhesive layer 32. In some embodiments, the ceramic particles have a maximum dimension between two and fifty microns and have a concentration from approximately three to forty percent by weight in the adhesive base. In some embodiments, the concentration is between ten and thirty percent by weight. The ceramic particles may include, for example, alumina, silica, aluminum nitride, silicon nitride, boron nitride, barium titanate and/or calcium titanate.

In a test of flexible circuit 30, a thermoplastic polyimide-based adhesive was used. To create the ceramic adhesive compound, this base adhesive was filled with eight micron alumina powder at a concentration of twenty percent by weight in the adhesive. Adhesive layer 32 had a thickness of twenty-five microns, the thickness of each of the interior, etched foil layers was approximately forty-three microns, and the metal foil was formed out of copper. The measured dielectric separation between the opposing inner metal foil layers was eight microns, and the minimum dielectric strength between these layers was measured to be approximately 300 volts.

In another test, the parameters used in the first test remained the same except that the thickness of the inner foil layers was changed to about nineteen microns. The measured dielectric separation between adjacent foil layers was about thirteen microns, and the minimum dielectric strength between these layers was measured to be approximately 1400 volts.

Among the advantages of the invention: Dielectric layers between adjacent conductive layers are not required. Conductive layers of the flexible circuit remain separated and electrically isolated during high temperature lamination. Thermal conductivity between the conductive layers is maximized. The thickness of the circuit assembly is minimized. The manufacturing cost of the circuit assembly is minimized. The adhesive layer is able to flow over an inner core that has a width different from that of the outer foil layer to be adhered. Because many possible embodiments may be made of the invention without departing from the scope thereof, it is to be understood that all matter herein set forth or shown in the accompanying drawings is to be interpreted as illustrative and not in a limiting sense.

While the present invention has been described with respect to a limited number of preferred embodiments, those skilled in the art will appreciate numerous modifications and variations therefrom. For example, though a flexible circuit was used in exemplary embodiments, the invention is equally applicable to printed circuit boards (PCBs). Also, if a greater dielectric separation is required, the size of the ceramic particles and/or the thickness of adhesive layer 32 can be increased. Further, though ceramic particles were discussed, any particles with similar properties may be used. The appended claims are intended to cover all such modifications and variations which occur to one of ordinary skill in the art.

What is claimed is:

1. A circuit assembly comprising:
   a substrate layer comprising a material suitable for use as a flexible circuit and having a thickness selected to enable use as a flexible circuit substrate;
   a first conductive layer mounted to the substrate layer;
   a second conductive layer disposed on a side of said first conductive layer opposite a side of said first conductive layer mounted to said substrate layer; and
   an adhesive layer mounting the first and second conductive layers together, the adhesive layer having dielectric, thermally conductive particles for separating the first and second conductive layers, the particles comprising a ceramic material.

2. The circuit assembly of claim 1, wherein the adhesive layer further comprises an adhesive base, and the particles have a concentration in the adhesive layer between two and forty percent.

3. The circuit assembly of claim 1, wherein a thickness of the adhesive layer is between four and fifty microns.

4. The circuit assembly of claim 1 wherein the adhesive layer includes a thermoplastic adhesive.

5. The circuit assembly of claim 1 wherein the adhesive layer includes a thermoset adhesive.

6. The circuit assembly of claim 1, wherein the first conductive layer comprises an etched circuit pattern.

7. The circuit assembly as defined in claim 1 wherein said particles are substantially devoid of void spaces therein.

8. A circuit assembly comprising:
   a substrate layer;
   a first conductive layer mounted to the substrate layer;
   a second conductive layer disposed on a side of said first conductive layer opposite a side of said first conductive layer mounted to said substrate layer; and
   an adhesive layer mounting the first and second conductive layers together, the adhesive layer having dielectric, thermally conductive particles for separating the first and second conductive layers, said particles substantially devoid of void spaces therein, the particles comprising a ceramic material.

9. The circuit assembly of claim 8, wherein at least one of the conductive layers is flexible.

10. The circuit assembly of claim 8, wherein the substrate layer comprises a flexible substrate of a flexible circuit.

11. The circuit assembly of claim 8, wherein the adhesive layer further comprises an adhesive base, and the particles have a concentration in the adhesive layer between two and forty percent.

12. The circuit assembly of claim 8, wherein a thickness of the adhesive layer is between four and fifty microns.

13. The circuit assembly of claim 8 wherein the adhesive layer includes a thermoplastic adhesive.

14. The circuit assembly of claim 8 wherein the adhesive layer includes a thermoset adhesive.

15. The circuit assembly of claim 8, wherein the first conductive layer comprises an etched circuit pattern.

* * * * *